United States Patent [19]

Ohori

[11] Patent Number: 5,455,519
[45] Date of Patent: Oct. 3, 1995

[54] JOSEPHSON LOGIC CIRCUIT

[75] Inventor: Tatsuya Ohori, Sagamihara, Japan

[73] Assignee: Fujitsu Limited, Kawasaki, Japan

[21] Appl. No.: 28,075

[22] Filed: Mar. 20, 1987

Related U.S. Application Data

[63] Continuation of Ser. No. 861,633, May 7, 1986, abandoned, which is a continuation of Ser. No. 498,559, May 26, 1983, abandoned.

[30] Foreign Application Priority Data

May 31, 1982 [JP] Japan ................................. 57-092802
Dec. 28, 1982 [JP] Japan ................................. 57-229707

[51] Int. Cl.$^6$ ............................................. H03K 19/195
[52] U.S. Cl. ............................. 326/3; 326/35; 327/367
[58] Field of Search ............................. 326/1, 3–6, 35; 327/367, 528

[56] References Cited

U.S. PATENT DOCUMENTS

| | | | |
|---|---|---|---|
| 4,117,354 | 9/1978 | Gheewala | 307/306 |
| 4,313,066 | 1/1982 | Gheewala | 307/306 |
| 4,371,796 | 2/1983 | Takada | 307/277 |
| 4,413,196 | 11/1983 | Josephs et al. | 307/306 |
| 4,482,821 | 11/1984 | Houkawa et al. | 307/462 |

OTHER PUBLICATIONS

IEEE Transactions on Electron Devices, "Josephson–logic Devices and Circuits", Gheewala, vol. ED–27, No. 10, Oct. 1980, pp. 1857–1869.
IBM Technical Disclosure Bulletin, "Compact Three–Terminal Josephson Switch", Faris et al., vol. 24, No. 3, Aug. 1981, pp. 1545–1546.
IEEE Transactions on Electron Devices, "A Three–Josephson Junction Direct Coupled Isolation Device", Wang et al., vol. ED–29, No. 3, Mar. 1982, pp. 414–417.
Applied Physics Letters, "Resistor Coupled Josephson Logic", Sone et al., vol. 40, No. 8, Apr. 15, 1982, pp. 741–744.

*Primary Examiner*—David R. Hudspeth
*Attorney, Agent, or Firm*—Staas & Halsey

[57] ABSTRACT

A Josephson logic circuit includes a Josephson element inserted between an input terminal and a reference electric potential such as ground, a resistor inserted between the input terminal and an input of the next stage of the Josephson circuit, and a current source which supplies an offset current to the Josephson element. By adjusting the offset current, the Josephson logic circuit can be operated as an AND circuit, an OR circuit, or a majority logic circuit having a high input sensitivity.

3 Claims, 7 Drawing Sheets

JOSEPHSON LOGIC CIRCUIT

This is a continuation of application Ser. No. 861,633 filed on May 7, 1986, which is a continuation of U.S. application Ser. No. 498,559, file May 26, 1983, both now abandoned.

BACKGROUND OF THE INVENTION

1. Field of the Invention

The present invention relates to a Josephson logic circuit. Especially, it relates to a logic circuit which is effective for forming an OR circuit, an AND circuit, or a majority logic circuit.

2. Description of the Prior Art

To rapidly process information, an electronic apparatus such as an electronic computer should operate rapidly and should be small in size.

Therefore, a Josephson element which has a much higher operation speed than does a conventional semi-conductor integrated circuit element should be considered for use as a functional element of an electric computer.

A logic circuit which utilizes such a Josephson element as a functional element, is current injection type of logic circuit. An AND circuit of current injection type in a logic circuit has a high input current margin. However, a function which separates the input and the output is not provided, and therefore, the AND circuit must be combined with an OR circuit.

A circuit which utilizes an asymmetrical Superconducting Quantum Interference Device (SQUID) element is also proposed to be employed in the AND circuit. However, in such an AND circuit, due to the threshold characteristics of the SQUID, the input signal level is dependent on the bias current level, with the result that the margin of operation is small.

Further, in an AND circuit which utilizes a Josephson element, a large amount of current is required to operate the AND circuit. Therefore, the whole output of the logic gate, that is, for example, an OR circuit connected to the previous stage of the AND circuit, should be injected into the AND circuit. Consequently, the number of outputs of the logic gate is limited to one.

If the AND circuit can be operated on a small output of the OR circuit connected to a next stage of the circuit, then a plurality of logic circuits or logic gates can be operated on the full output of the OR circuit.

OBJECTS AND SUMMARY OF THE INVENTION

An object of the present invention is to provide a novel Josephson logic circuit from which can be formed an AND circuit and a majority logic circuit in which the input and the output are separated and the input signal level is not dependent on the bias current level.

Another object of the present invention is to provide a novel Josephson logic circuit from which an OR circuit having a high input-output gain can be formed.

A further object of the present invention is to provide a novel Josephson logic circuit from which can be formed an AND circuit and a majority logic circuit having a very simple construction and can operate on a smaller current level than that of prior art devices so that the number of outputs of the logic gate connected to a next stage of the Josephson logic circuit can be increased.

According to the present invention, the above-mentioned object can be achieved by providing a Josephson logic circuit comprising a Josephson element inserted between an input terminal and a reference electric potential, a resistor which is inserted between the input terminal and an input of a next stage of the Josephson circuit, and a current source which supplies an offset current to the Josephson element.

Further, according to the present invention, the above-mentioned object can be achieved by providing a Josephson logic circuit comprising a first Josephson element connected between a first input signal line and a reference electric potential, a second Josephson element connected between a second input signal line and the reference electric potential, a first resistor and a second resistor connected in series between the first input signal line and the second input signal line, a third Josephson element connected between the connection point of the first and second resistors and the reference electric potential, an output signal line led out of the connection point of the first and second resistors, and means for supplying an offset current to the first and second Josephson elements.

Further features and advantages of the present invention will be apparent from the ensuing description, made with reference to the accompanying drawings, to which, however, the scope of the invention is in no way limited.

DESCRIPTION OF THE PREFERRED EMBODIMENTS

Figure 1A:
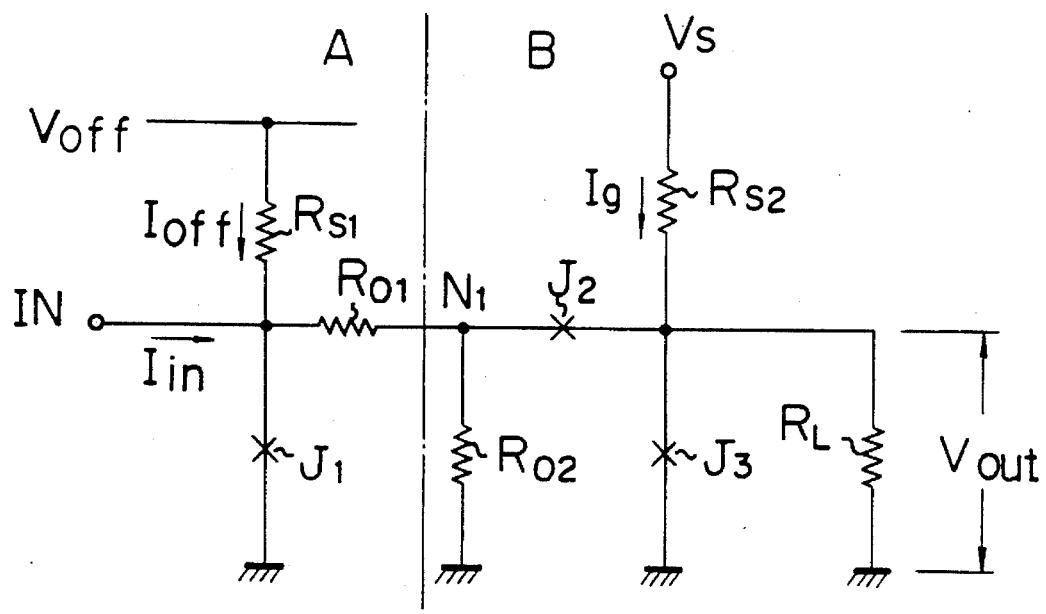
FIG. 1A is a circuit diagram of a Josephson logic circuit according to the present invention.

FIG. 1A illustrates the construction of a Josephson logic circuit according to the present invention. In FIG. 1A, $J_1$, $J_2$, and $J_3$ designate Josephson elements, each of the Josephson elements having critical currents of $I_{01}$, $I_{02}$, and $I_{03}$, respectively. $R_{01}$ and $R_{02}$ designate resistors having a relatively small resistance value, such as 0.5 to 1($\Omega$), and $R_{S1}$ and $R_{S2}$ designate resistors having a relatively large resistance value, such as 30 to 40($\Omega$). $R_L$ designates a load resistance, and $V_S$ designates a supply voltage. $I_g$ designates a gate current, $V_{off}$ designates an offset voltage, $I_{off}$ designates an offset current, and $I_{in}$ designates an input signal current.

In FIG. 1A, the portion A forms an input circuit portion which is a characteristic feature of the present invention, and the portion B forms an output logic circuit which is conventionally used. Such output logic circuit is called JAWS (Josephson Atto Weber Switch). The node $N_1$ forms the input point for the output logic circuit portion B.

In such a construction, when the sum of the input signal current $I_{in}$ and the offset current $I_{off}$ has a value which does not exceed the critical current of the Josephson element $J_1$, the input signal current $I_{in}$ flows into the Josephson element $J_1$ towards the reference electric potential such as ground potential, and the gate current $I_g$ flows into the Josephson element $J_3$ toward the reference electric potential, such as ground potential.

When the sum of the input signal current $I_{in}$ and the offset current $I_{off}$ exceeds the critical current value of the Josephson element $J_1$, the Josephson element $J_1$ assumes a non-zero voltage state (a high resistance state) and the sum the input signal current $I_{in}$ and the offset current $I_{off}$ flows via the Josephson element $J_2$ into the Josephson element $J_3$, with the result that the Josephson element $J_3$ assumes a non-zero voltage state.

Because the Josephson element $J_3$ assumes a non-zero voltage state, the current $I_{in}+I_g+I_{off}$ flows in the resistor $R_{02}$ and the load resistor $R_L$. If the ratio $R_L/R_{02}$ is selected as a sufficiently large value, the greater part of the current $I_g$ flows into the Josephson element $J_2$ and the resistor $R_{02}$ toward the reference electric potential, with the result that the Josephson element $J_2$ assumes a non-zero voltage state.

When the Josephson element $J_2$ assumes a non-zero voltage state, the gate current $I_g$ flows into the load resistor $R_L$, with the result that the output voltage $V_{out}$ appears between two terminals of the load resistor $R_L$.

That is, in the Josephson logic circuit according to the present invention, the input signal current and the gate current flow independently of each other until the value of the input signal current reaches the threshold value. When the input signal current exceeds the threshold value, the input signal is injected into the Josephson element $J_3$ where the gate current flows. Therefore, if the offset current $I_{off}$ which sets the threshold value of the input signal current, is suitably selected, a circuit which is suitable for use as an AND circuit or an OR circuit can be constructed.

Therefore, according to the present invention, the circuit which can suitably form an AND circuit or an OR circuit can be constructed by selecting the value of the offset current $I_{off}$ which sets the threshold value of the input signal current.

Figure 1B:
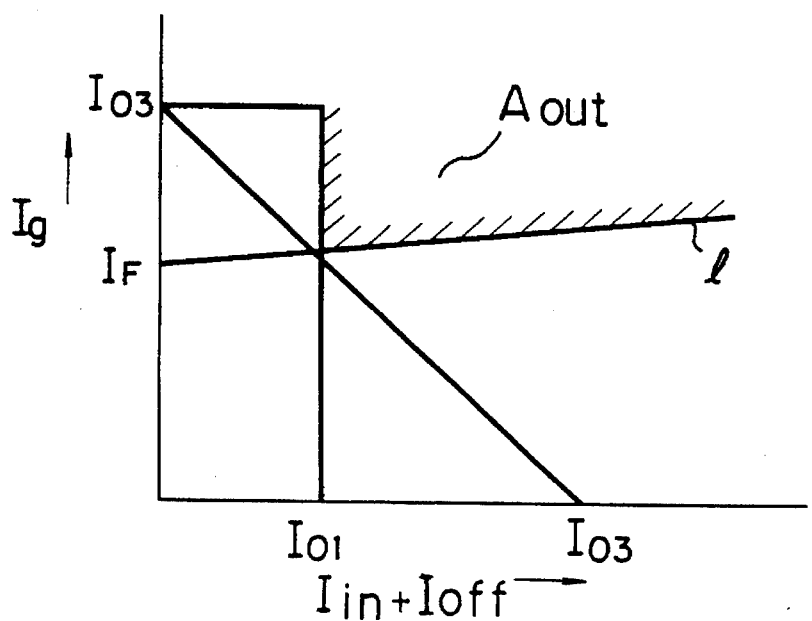
FIG. 1B is a graph of the threshold characteristics of the Josephson logic circuit shown in FIG. 1A.

FIG. 1B is a graph of the characteristic of the threshold value of the logic circuit shown in FIG. 1A. In FIG. 1B, the ordinate designates the gate current $I_g$ and the abscissa designates the sum of the input signal current $I_{in}$ and the offset current $I_{off}$.

In the logic, circuit shown in FIG. 1A, the allowable gate current is determined by the critical current $I_{03}$ of the Josephson element $J_3$, and the threshold value of the input signal current $I_{in}$ is determined, as has already been mentioned, by the value $I_{01}-I_{off}$.

Therefore, when the Josephson element $J_1$ is in a non-zero voltage state, the condition in which the output voltage $V_{out}$ appears can be shown by the following equations:

$$I_g + I_{in} + I_{off} > I_{03} \qquad (1)$$

$$\frac{R_L}{R_L+R_{02}} I_g - \frac{R_{02}}{R_L+R_{02}} (I_{in}+I_{off}) > I_{02} \qquad (2)$$

Further, in FIG. 1B, $I_F$, which is a parameter of a lower limit of the bias current, is determined by the equation:

$$I_F = \frac{R_L+R_{02}}{R_L} I_{02}$$

Therefore, in FIG. 1B, the hatched area $A_{out}$ shows the range of $I_{in}$ and $I_g$ in which the output voltage $V_{out}$ appears.

Further, for the purpose of realizing good separation between the input and the output and for obtaining a large bias margin (that is, the inclination of the line 1 is made small), the value of the resistors $R_{01}$ and $R_{02}$ is preferably made small and is in the range where the Josephson element $J_1$ is operated in a latching mode.

Figure 2A:
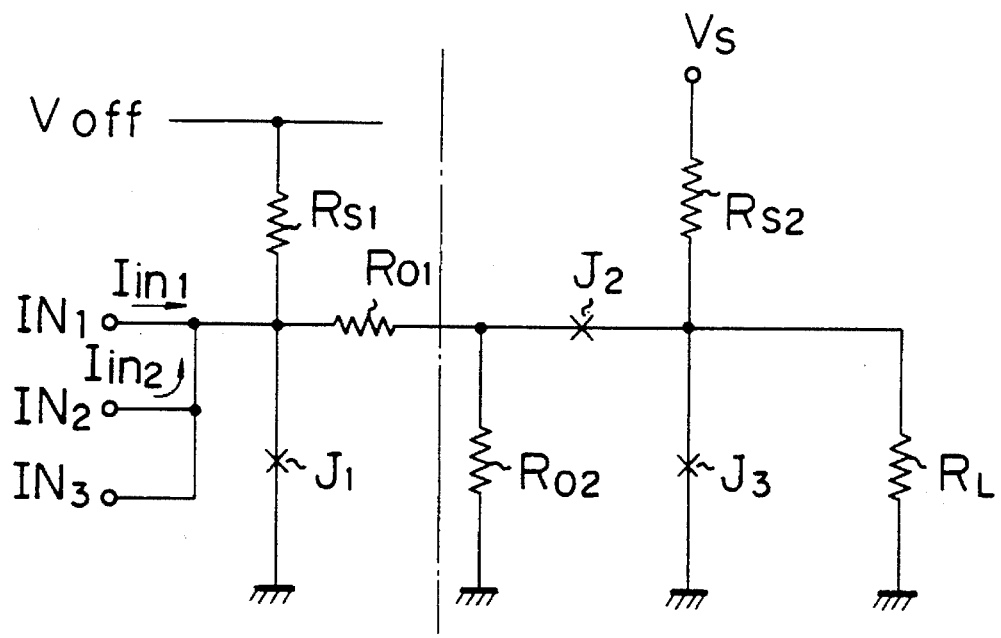
FIG. 2A is a circuit of an embodiment of the present invention.
Figure 2B:
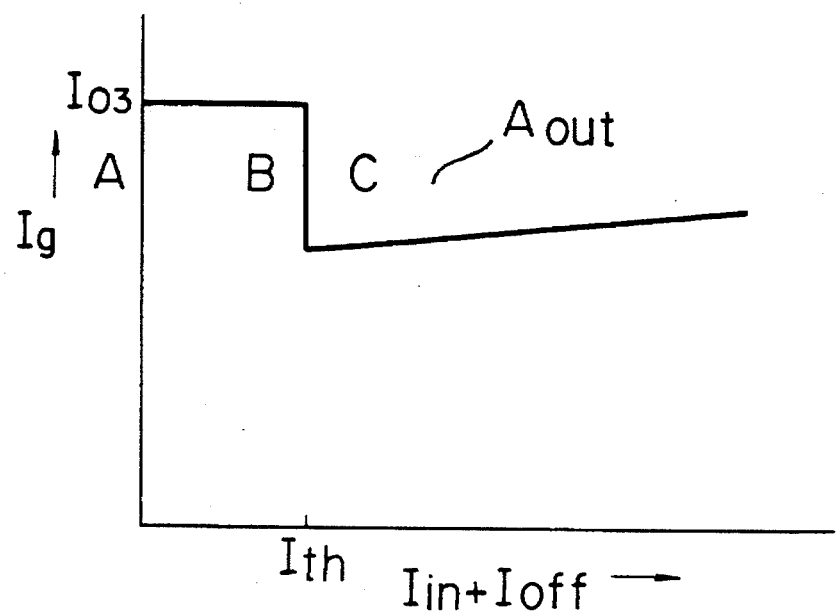
FIG. 2B is a graph of the threshold characteristics of the circuit shown in FIG. 2A.

FIG. 2A is a logic circuit which is used as an AND circuit according to the present invention, and FIG. 2B shows the condition for setting the threshold value in the circuit shown in FIG. 2A.

That is, when the offset current $I_{off}$ is made zero or very small, the threshold value $I_{th}$ of the input signal current $I_{in}$ is made large, and the input signals $I_{in1}$ and $I_{in2}$ are injected into the input terminals $IN_1$ and $IN_2$ after the operational point A is set. As is shown in FIG. 2B, the relationship $I_{in1}+I_{in2}>I_{th}$ is obtained (as is shown point c in FIG. 2B), and the output voltage $V_{out}$ is obtained. If the input signal current is supplied to only the input terminal $IN_1$ or $IN_2$, the relationship between $I_g$ and $I_{in}$ remains at point B, shown in FIG. 2B, with the result that the output voltage $V_{out}$ cannot be obtained. That is, an AND circuit is formed.

Further, in FIG. 2A, when a third input terminal $IN_3$ is provided so as to supply the input signal current, a two-thirds majority logic circuit can be formed. In such an AND circuit, which is different than the conventional AND circuit formed from a conventional current injection-type logic circuit, separation of the input and the output is possible, and no combination with an OR circuit is necessary.

Figure 3A:
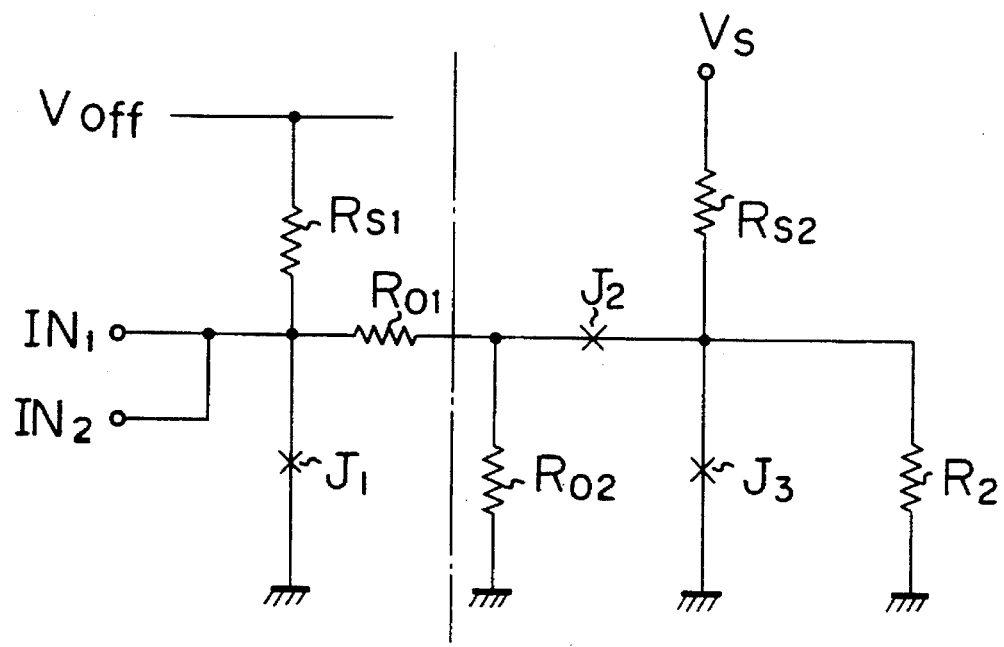
FIG. 3A is a circuit of another embodiment of the present invention.
Figure 3B:
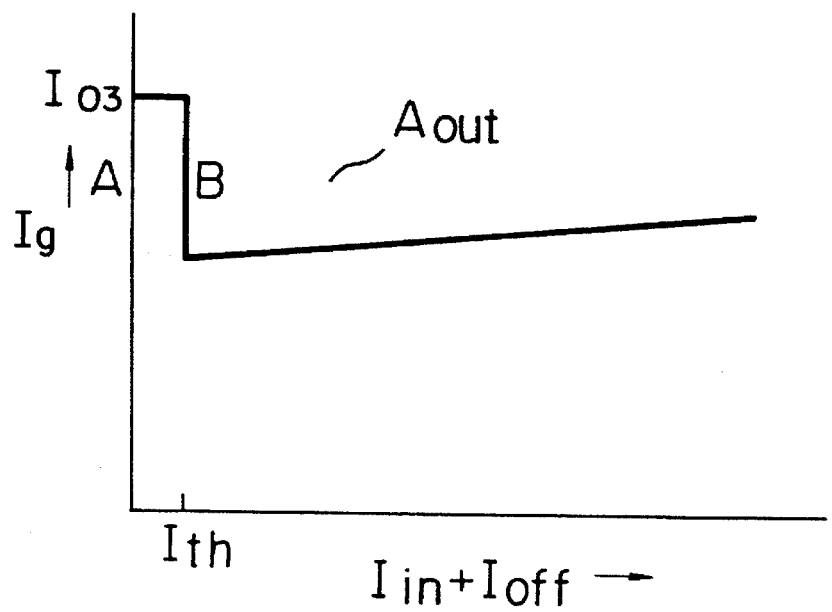
FIG. 3B is a graph of the threshold characteristics of the circuit shown in FIG. 3A.

FIG. 3A is a logic circuit used as an OR circuit according to the present invention, and FIG. 3B shows the condition for setting the threshold value.

In the OR circuit in FIG. 3A, the value of the offset current $I_{off}$ is made large compared with the already mentioned AND circuit, and the threshold value ($I_{th}$) of the input signal current $I_{in}$ is made small.

When the threshold value ($I_{th}$) is set in such a manner and the input signal current $I_{in1}$ or $I_{in2}>I_{th}$ is supplied to one of the input terminals $IN_1$ and $IN_2$, the output voltage $V_{out}$ can be obtained.

That is, according to the present invention, an AND circuit, a majority circuit, or an OR circuit can be formed by setting the offset current of the input signal current.

Figure 4:
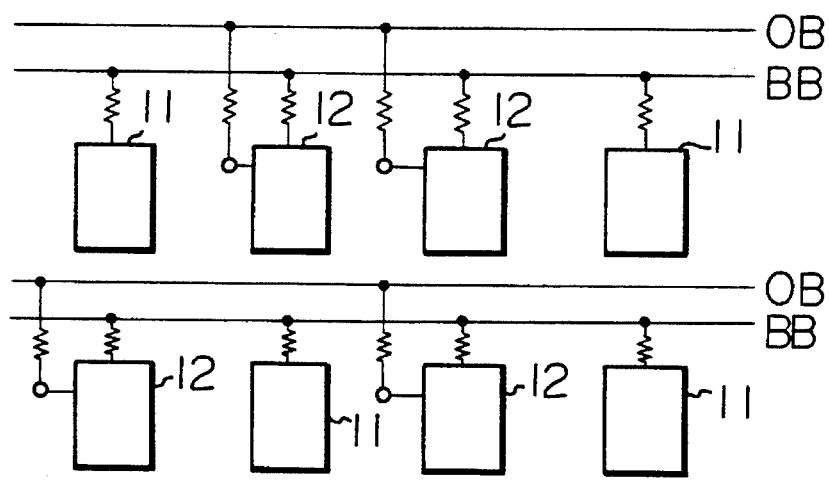
FIG. 4 is a diagram of a connection formed by integrating a plurality of Josephson logic circuits, according to the present invention.

Further, when a plurality of logic circuits according to the present invention is integrated, and when the offset current, supplied or not, is selected an AND circuit and an OR circuit, etc. can be formed from a large-scale Josephson integrated circuit which has a master-slice construction. FIG. 4 is a block diagram of such a circuit. In FIG. 4, the input terminal and the output terminal of each logic circuit are not shown, 11 designates an AND circuit, and 12 designates an OR circuit. OB designates an offset bus line, and BB designates a bias bus line.

Further, in the Josephson logic circuit of the present invention, the input circuit portion A in FIG. 1A can be combined not only with the Josephson output logic circuit portion B in FIG. 1A but also with any other Josephson logic circuit, with the result that the threshold value of such a logic circuit can be set in a suitable condition. That is, the logic circuit may form, besides the aforementioned JAWS, other wellknown circuits, such as 4JL, DCL (Direct Coupled Logic) or RCJL (Resistor Coupled Josephson Logic).

Concerning the above-mentioned logic circuits, JAWS is disclosed, for example, in the article "Current switched Josephson Latching Logic Gates With Sub-100ps Delays in IEEE TRANSACTIONS ON MAGNETICS, Vol MAG-15, No. 6, November, 1979" pp. 1886 to 1888.

Further, a DCL circuit is disclosed, for example, in the article "Josephson-Logic Device and Circuits, IEEE TRANSACTIONS ON ELECTRON DEVICES, Vol ED-27, No.10, October 1980, pp. 1857 to 1869, in particular part B—"Direct-Coupled Isolation (DCI) Devices" (p. 1,860, right column through p. 1,862, left column).

Also, in RCJL circuit is disclosed, for example, in the article "Resistor Coupled Josephson Logic" in "Applied Physics Letters 40(8), 15 Apr. 1982, pp. 741 to 744.

Further, a 4JL is disclosed, for example, in the article in Japanese Journal of Applied Physics Vol. 21, 1982, p 198.

As has already been mentioned, according to the circuit shown in FIGS. 2A and 2B, an AND circuit which can separate the input and the output and which has an input signal level independent of the bias current level and an OR circuit which has a high gain can be constructed from one circuit. Therefore, when a Josephson integrated circuit is formed with such an AND circuit and such an OR circuit, the Josephson circuit is very effective.

Figure 5A:
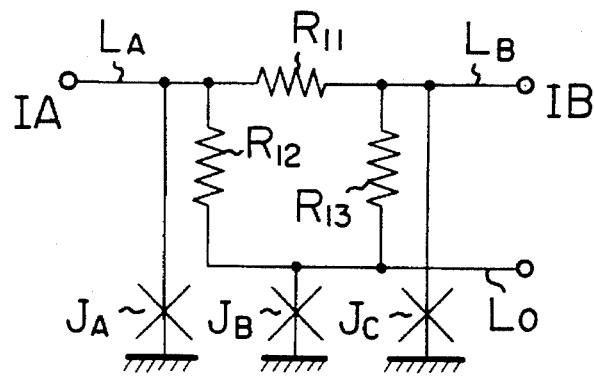
FIG. 5A is a prior art AND circuit which utilizes Josephson elements.
Figure 5B:
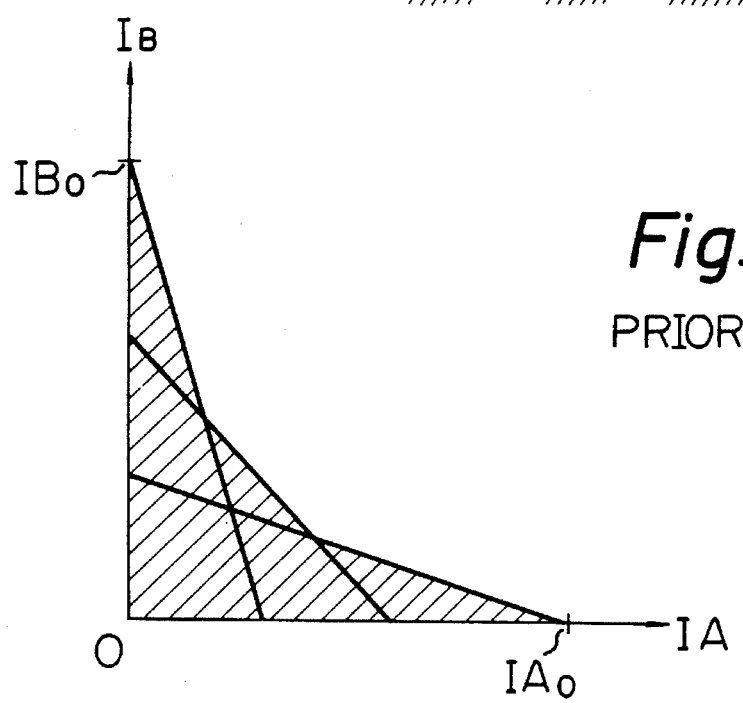
FIG. 5B is a graph of the threshold characteristic line and the operation of the circuit shown in FIG. 5A.

Further, FIG. 5A is a conventional Josephson logic AND circuit, and FIG. 5B is a diagram explaining the operation of the circuit shown in FIG. 5A.

In FIG. 5A, JA, JB, and JC are Josephson elements, $R_{11}$ to $R_{13}$ are resistors, LA and LB are input signal lines, and LO is an output signal line.

The threshold characteristic of the AND circuit is as is shown in FIG. 5B.

In FIG. 5B, IA is a current which is input into the input signal line LA, $IA_0$ is a critical current, IB is a current which is input into the input signal line LB, and $IB_0$ is a critical current.

In this conventional example, the output cannot appear inside the hatched portion shown in FIG. 5B. The output appears outside of the hatched portion. Therefore, for example, when the input is applied to the input signal line LA but is not applied to the input signal line LB, the output does not appear. Even in the opposite case, the output does not appear. The output appears when both input signal lines LA and LB receive the input, and thereby the AND operation is carried out.

It is assumed that when the area outside the hatched portion in FIG. 5B is increased, the working margin is increased.

Junction area in the Josephson element is set by design, and the value of the critical current is determined by the predetermined junction area. Therefore, the decrease of the critical currents $IA_0$ and $IB_0$ in the Josephson element is limited.

Because the critical currents $IA_0$ and $IB_0$ are large, as was mentioned above, to operate this AND circuit, the flow of a large current is necessary. This results in that the whole output of the logic gate, that is, for example, an OR circuit connected to the input of the AND circuit, must be injected into the AND circuit. Therefore, the number of outputs of the logic gate is limited to one.

If the AND circuit can be operated on a small output of the OR circuit connected to the input of the AND circuit, then a plurality of logic circuits can be operated on the full output of the OR circuit.

Figure 6A:
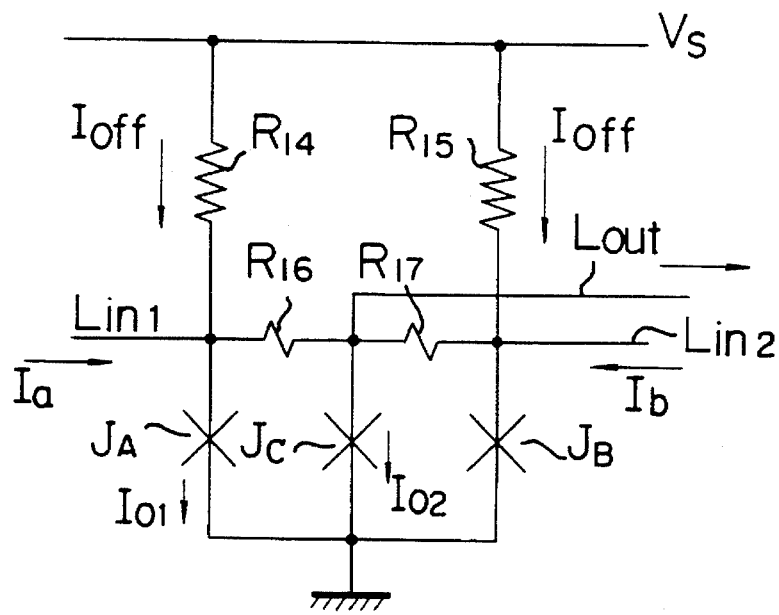
FIG. 6A is a circuit of another embodiment of an AND circuit according to the present invention.
Figure 6B:
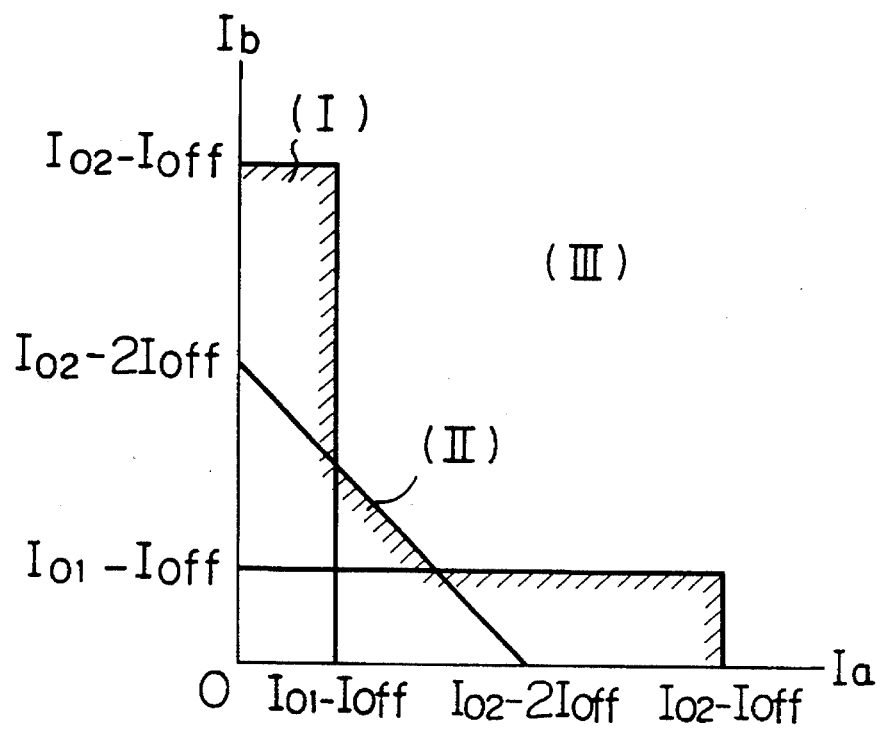
FIG. 6B is graph of the threshold characteristic line and the operation area of the circuit shown in FIG. 6A.

FIG. 6A is a circuit diagram of an essential portion of an embodiment of the present invention, and FIG. 6B is a diagram of the threshold characteristics of the embodiment shown in FIG. 6A.

In FIG. 6A, $R_{14}$ to $R_{17}$ are resistors, $J_A$, $J_B$, and $J_C$ are Josephson elements (first, second, and third Josephson elements), $L_{out}$ is an output signal line, $L_{in1}$ and $L_{in2}$ are a first input signal line and a second input signal line, respectively, $V_s$ is a constant supply voltage for the circuit, $I_{off}$ is an offset current, $I_a$ and $I_b$ are input signal currents, and $I_{01}$ and $I_{02}$ are critical currents flowing through the Josephson elements $J_A$, and $J_B$, $J_C$ and $J_C$. In FIG. 6A, resistors $R_{14}$ and $R_{15}$ are constant current resistors, and resistors $R_{16}$ and $R_{17}$ are separation resistors.

Next, the operation of the embodiment shown in FIG. 6A is explained with reference to FIG. 6B considering the following conditions:

$$0 \leq I_a < I_{01} - I_{off} \text{ and}$$

$$I_{01} - I_{off} \leq I_b < I_{02} - I_{off} \quad (1)$$

(the area I in FIG. 6B).

In such an area I, the Josephson element $J_B$ is switched to a non-zero voltage state and the current $I_{off} + I_b$ flows into the Josephson element $J_C$. However, the Josephson element $J_C$ is not switched, with the result that no output appears on the output signal line $L_{out}$.

$$I_{01} - I_{off} < I_a + I_b \text{ and}$$

$$I_{02} - 2I_{off} > I_a + I_b \quad (2)$$

(the area II in FIG. 6B).

In such an area II, the Josephson elements $J_A$ and $J_B$ are switched. However, the current which flows into the Josephson element $J_C$ does not exceed the critical current $I_{02}$, and therefore, no output appears.

$$I_{01} - I_{off} < I_a + I_b \text{ and}$$

$$I_{02} - 2I_{off} < I_a + I_b \quad (3)$$

(the area III in FIG. 6B).

In such an area III, the Josephson elements $J_A$, $J_B$, and $J_C$ are all switched, and, therefore, an output appears.

As is apparent from the above explanation, the line which separates the hatched portion and the non-hatched portion in FIG. 6B is the threshold characteristic curve.

Now, referring to the embodiment shown in FIG. 6A, it is very easy to decrease the threshold level of the AND gate. For example, to decrease the current $I_{02} - I_{off}$ corresponding to the critical current $I_{B0}$ shown in FIG. 5B, the current $I_{off}$ may be increased, and the current $I_{off}$ may be adjusted at will because it is supplied from the exterior. It should be understood that the other critical currents may be dealt with in the same manner.

Figure 7A:
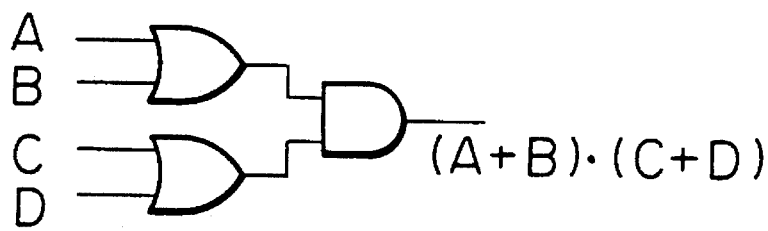
FIGS. 7A and 7B are prior art block diagrams a conventional circuit.

FIG. 7A is a block diagram of the connection between conventional OR circuits and an AND circuit. In FIG. 7A, A, B, C, and D designate input signals.

To drive the conventional AND circuit shown in FIG. 7A, a comparatively large current level is necessary, as was mentioned above. Therefore, as is apparent from FIG. 7A, all of the outputs of the OR circuits should be connected to the AND circuit so that the number of fan-outs of the OR circuits is limited to one.

Figure 7B:
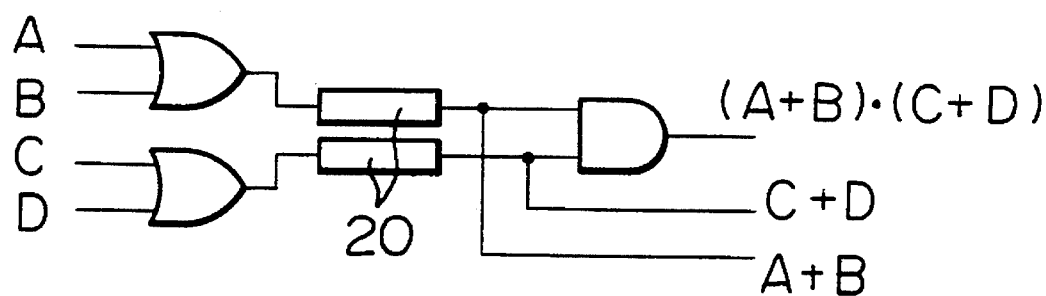

If it is necessary that the outputs of the OR circuits be connected to a plurality of logic circuits by using conventional AND circuits, the outputs of the OR circuits must be amplified with a current amplifier 20 shown in FIG. 7B.

Figure 7C:
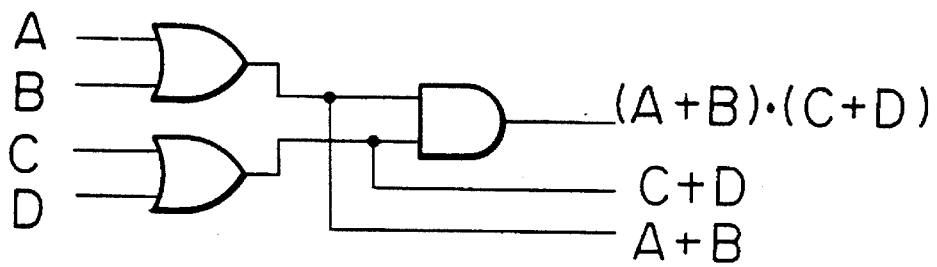
FIG. 7C is a block diagram of a circuit according to the present invention.

FIG. 7C is a block diagram of the connection between OR circuits and an AND circuit which is an embodiment of the present invention. In the circuit shown in FIG. 7C, as is apparent from the threshold characteristics shown in FIG. 6B, if the values of the offset current and the critical current are suitably selected, the AND operation can be carried out with a small current level. Further, since the offset current flows to the output line, the output level of the AND circuit becomes large, with the result that the logic circuit connected to the next stage of the AND circuit can be sufficiently driven. Therefore, as is shown in FIG. 7C, the number of fan-outs of the OR circuits connected to the next stage of the AND circuit can be increased.

Figure 8:
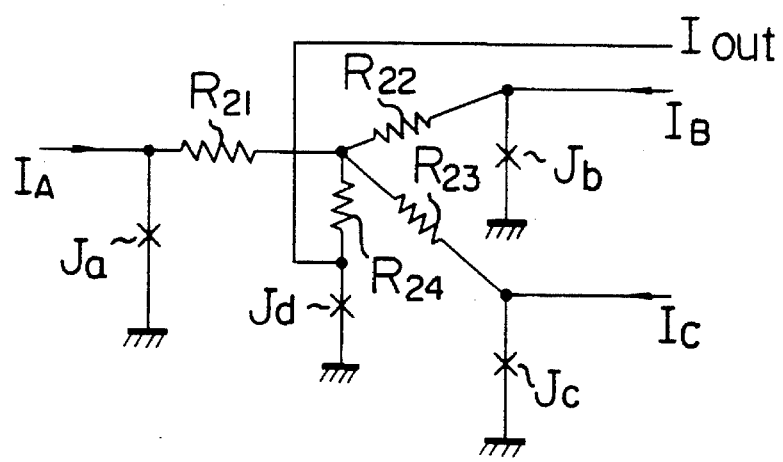
FIG. 8 is a prior art diagram of a majority logic circuit which utilizes Josephson elements.

FIG. 8 is a conventional two-thirds majority logical circuit which was reported in the Appl. Phys. Lett., Vol. 40, No. 8, 15 Apr. 1982 P. 741~744. In FIG. 8, $J_a$, $J_b$, $J_c$, and $J_d$ designate Josephson elements, $R_{21}$, $R_{22}$, $R_{23}$, and $R_{24}$ designate resistors, $I_A$, $I_B$, and $I_C$ designate input currents, and $I_{out}$ designates an output current. This circuit has a wide operation region. However, since all of the output currents of the logic circuits connected to the circuit must be injected into the circuit as the input currents $I_A$, $I_B$, and $I_C$, the number of fan-outs, from the circuit is limited to one.

Figure 9:
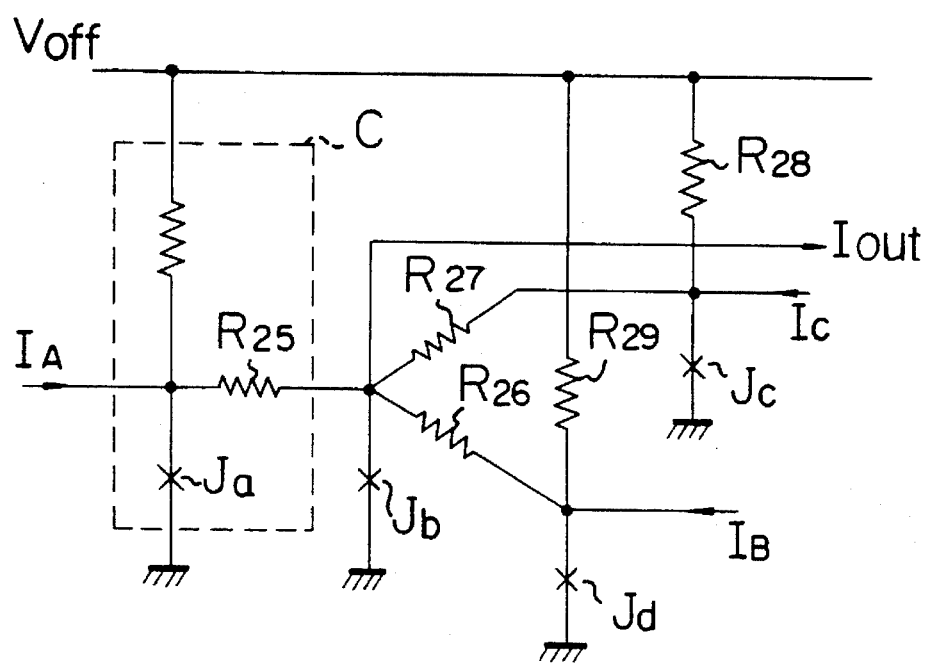
FIG. 9 is a circuit diagram of a majority logic circuit which utilizes Josephson elements, according to the present invention.

FIG. 9 is a circuit in which the drawback of the circuit shown in FIG. 8 is eliminated. When the portion C is removed from the circuit of FIG. 9, the circuit is the same as the circuit shown in FIG. 6A. By adding the portion C to the circuit shown in FIG. 6A, a two-thirds majority logic circuit which has a high input sensitivity, due to an offset current being supplied thereto, can be obtained.

Further, as is apparent from FIG. 9, this circuit has a symmetry with respect to $I_A$, $I_B$, and $I_C$, with the result that this circuit operates as an AND circuit for $I_A$ and $I_B$, $I_B$ and $I_C$, and $I_C$ and $I_A$. That is, the logic equation of this circuit can be expressed as a two-thirds majority logical operation:

A·B+B·C+A·C

This circuit has a characteristic which is substantially the same as that of the AND circuit shown in FIG. 6A.

In the circuits shown in FIG. 6A and FIG. 9, the Josephson logic circuit can be driven by a small current level, and therefore, the charge on the logic gate connected to an additional logic circuit can be decreased with the result that the number of elements used can be decreased, as can the operation time and the occupied area.

I claim:

1. A Josephson logic circuit including first and second input signal lines and operatively connected to receive a reference electric potential, comprising:

a first Josephson element operatively connected to the first input signal line and to receive the reference electric potential;

a second Josephson element operatively connected to the second input signal line and to receive the reference electric potential;

first and second resistors connected in series to each other at a first node and directly connected to the first input signal line and the second input signal line, respectively;

a third Josephson element operatively connected to the first node and to receive the reference electric potential;

an output signal line operatively connected to the first node; and offset means, operatively connected to said first and second Josephson elements, for supplying an offset current to said first and second Josephson elements.

2. A Josephson logic circuit according to claim 1, further comprising:

a third input signal line;

a fourth Josephson element operatively connected to said third input signal line at a second node and to receive the reference electric potential;

a third resistor operatively connected to the second node and to the first node; and means, operatively connected to said fourth Josephson element, for supplying an offset current to said fourth Josephson element so that said Josephson logic circuit is operated as a two-thirds majority logic circuit.

3. A Josephson logic circuit including first, second and third input signal lines and operatively connected to receive a reference electric potential, comprising:

a first Josephson element operatively connected to the first input signal line and to receive the reference electric potential;

a second Josephson element operatively connected to the second input signal line and to receive the reference electric potential;

first and second resistors operatively connected in series to each other at a first node and between the first input signal line and the second input signal line;

a third Josephson element operatively connected to the first node and to receive the reference electric potential;

an output signal line operatively connected to the first node;

offset means, operatively connected to said first and second Josephson elements, for supplying an offset current to said first and second Josephson elements;

a fourth Josephson element, operatively connected to the third input signal line at a second node and operatively connected to receive the reference electric potential;

a third resistor operatively connected to the first and second nodes; and means, operatively connected to said fourth Josephson element, for supplying an offset current to said fourth Josephson element so that said Josephson logic circuit is operated as a two-thirds majority logic circuit.

* * * * *

UNITED STATES PATENT AND TRADEMARK OFFICE
CERTIFICATE OF CORRECTION

PATENT NO. : 5,455,519

DATED : October 3, 1995

INVENTOR(S) : Tatsuya OHORI

It is certified that error appears in the above-indentified patent and that said Letters Patent is hereby corrected as shown below:

Col. 3, line 25, after "potential" insert --,--;

Col. 4, line 25, delete "1" and insert --$\ell$--;

Col. 5, line 45, delete "is" (second occurrence);

*Col. 6, line 21, delete "$J_A$" and insert --$J_A$ and $J_C$--;
line 22, delete "and $J_B$, $J_C$ and $J_C$" and insert --and, $J_B$ and $J_C$--.

Signed and Sealed this

Thirteenth Day of February, 1996

Attest:

BRUCE LEHMAN

*Attesting Officer*    *Commissioner of Patents and Trademarks*